(12) United States Patent
You et al.

(10) Patent No.: US 9,520,300 B2
(45) Date of Patent: Dec. 13, 2016

(54) SEMICONDUCTOR DEVICES AND METHODS OF FABRICATING THE SAME

(71) Applicant: Samsung Electronics Co., Ltd., Suwon-si (KR)

(72) Inventors: Wookyung You, Suwon-si (KR); Jongmin Baek, Suwon-si (KR); Sanghoon Ahn, Goyang-si (KR); Sangho Rha, Seongnam-si (KR); Naein Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/606,970

(22) Filed: Jan. 27, 2015

(65) Prior Publication Data
US 2015/0332955 A1 Nov. 19, 2015

(30) Foreign Application Priority Data

May 15, 2014 (KR) ........................ 10-2014-0058402

(51) Int. Cl.
*H01L 21/768* (2006.01)
*H01L 21/311* (2006.01)
*H01L 21/02* (2006.01)
*H01L 23/522* (2006.01)
*H01L 23/532* (2006.01)

(52) U.S. Cl.
CPC ....... *H01L 21/311* (2013.01); *H01L 21/02208* (2013.01); *H01L 21/02271* (2013.01); *H01L 21/02345* (2013.01); *H01L 21/31144* (2013.01); *H01L 21/7682* (2013.01); *H01L 21/76834* (2013.01); *H01L 21/76877* (2013.01); *H01L 23/5222* (2013.01); *H01L 23/53295* (2013.01);
(Continued)

(58) Field of Classification Search
CPC .................................................. H01L 29/0649
See application file for complete search history.

(56) References Cited

U.S. PATENT DOCUMENTS 7,741,228 B2 6/2010 Ueki et al.
8,344,474 B2 1/2013 Seidel et al.
(Continued)

FOREIGN PATENT DOCUMENTS

KR 10-2003-0083174 A 10/2003
KR 10-2008-0030161 A 4/2008

OTHER PUBLICATIONS

Orlowski et al, 'Si, SiGe, Ge, and III-V Semiconductor Nanomembranes and NanowiresEnabled by SiGe Epitaxy', ECS Transactions, 33, (6), (2010), pp. 777-789.

*Primary Examiner* — Fernando L Toledo
*Assistant Examiner* — Valerie N Newton
(74) *Attorney, Agent, or Firm* — Muir Patent Law, PLLC

(57) ABSTRACT

The present disclosure describes semiconductor devices and methods of fabricating the same. The method includes forming an interlayer insulating layer on a substrate and forming conductive patterns in the interlayer insulating layer. A pore density of an upper portion of the interlayer insulating layer is higher than that of a lower portion of the interlayer insulating layer, and a pore density of an intermediate portion of the interlayer insulating layer gradually increases toward the upper portion of the interlayer insulating layer. An air gap is provided between the conductive patterns.

20 Claims, 10 Drawing Sheets

(52) U.S. Cl.
CPC ................ *H01L 2221/1047* (2013.01); *H01L 2924/0002* (2013.01)

(56) References Cited

U.S. PATENT DOCUMENTS

| | | |
|---|---|---|
| 8,420,528 B2 | 4/2013 | Noguchi |
| 2009/0121356 A1 | 5/2009 | Nakagawa |
| 2010/0133648 A1 | 6/2010 | Seidel et al. |
| 2010/0319971 A1* | 12/2010 | Lin ................... C09D 183/04 174/258 |
| 2012/0319279 A1 | 12/2012 | Isobayashi |
| 2014/0312456 A1* | 10/2014 | Kim ................... H01L 29/0649 257/522 |

* cited by examiner

SEMICONDUCTOR DEVICES AND METHODS OF FABRICATING THE SAME

CROSS-REFERENCE TO RELATED APPLICATION

This U.S. non-provisional patent application claims priority under 35 U.S.C. §119 to Korean Patent Application No. 10-2014-0058402, filed on May 15, 2014, in the Korean Intellectual Property Office, the disclosure of which is hereby incorporated by reference in its entirety.

BACKGROUND

The present disclosure relates to semiconductor devices and methods of fabricating the same, more particularly, to semiconductor devices including interconnection structures and methods of fabricating the same.

As semiconductor devices have become highly integrated and capacity of semiconductor devices has increased, pitches of metal interconnections in semiconductor devices has been reduced. Thus, parasitic capacitances of semiconductor devices may be increased, so operation speeds of semiconductor devices may be reduced. To reduce the parasitic capacitances of semiconductor devices, various research is conducted for low-resistance copper interconnections and low-k dielectrics.

SUMMARY

Embodiments of the inventive concepts may provide semiconductor devices capable of improving reliability and methods of fabricating the same.

Embodiments of the inventive concepts may also provide semiconductor devices capable of reducing a parasitic capacitance and improving an operation speed and methods of fabricating the same.

In one aspect, a method of fabricating a semiconductor device may include: forming an interlayer insulating layer on a substrate, the interlayer insulating layer comprising: a first portion being adjacent to the substrate and having a first pore density; a second portion formed on the first portion; and a third portion formed on the second portion and having a second pore density higher than the first pore density, and a pore density of the second portion gradually increasing toward the third portion; forming conductive patterns penetrating the third portion of the interlayer insulating layer; etching the third portion of the interlayer insulating layer to reduce a height of the interlayer insulating layer; and forming a capping insulation layer on the conductive patterns. An air gap may be formed between the conductive patterns.

In some embodiments, the pore density of the second portion of the interlayer insulating layer may be higher than or equal to the first pore density and may be lower than or equal to the second pore density.

In some embodiments, forming the interlayer insulating layer may be performed by a deposition process having a first deposition duration and a second deposition duration. The deposition process being performed by using a silicon precursor gas, an organic precursor gas, and a porogen gas. Supply rates of the organic precursor gas and the porogen gas may be gradually increased in the first deposition duration, and supply rates of the silicon precursor gas, the organic precursor gas, and the porogen gas may be constant in the second deposition duration.

In some embodiments, forming the interlayer insulating layer may include: forming porogen portions in the interlayer insulating layer; and forming pores in the interlayer insulating layer by removing the porogen portions.

In some embodiments, forming the pores may include: applying heat or an ultraviolet ray to the interlayer insulating layer to remove a hydrocarbon material included in the porogen portions.

In some embodiments, an atomic ratio of carbon in the third portion of the interlayer insulating layer may be greater than that of the first portion of the interlayer insulating layer, and an atomic ratio of carbon in the second portion of the interlayer insulating layer may be gradually increased toward the third portion of the interlayer insulating layer.

In some embodiments, an etch rate of the third portion of the interlayer insulating layer may be higher than that of the first portion of the interlayer insulating layer.

In some embodiments, the substrate may include a first region and a second region and the conductive patterns may be formed in the first region. In this case, etching the third portion of the interlayer insulating layer may include: forming a mask pattern exposing the interlayer insulating layer of the first region; and etching the third portion of the interlayer insulating layer of the first region using the mask pattern as an etch mask.

In some embodiments, a bottom surface, formed at between the conductive patterns after etching the third portion, of the interlayer insulating layer may be disposed at the same level as or a higher level than bottom surfaces of the conductive patterns.

In some embodiments, forming the air gap may comprise forming a groove between the conductive patterns by etching the third portion of the interlayer insulating layer, and forming the capping insulation layer to close an upper portion of the groove.

In another aspect, a method of fabricating a semiconductor device may include: forming an interlayer insulating layer on a substrate; forming recesses in the interlayer insulating layer; forming conductive patterns filling the recesses; removing an upper portion of the interlayer insulating layer disposed between the conductive patterns to reduce a height of the interlayer insulating layer; and forming a capping insulation layer on the conductive patterns to form an air gap between the conductive patterns. The interlayer insulating layer may be formed by a deposition process including a first deposition duration and a second deposition duration. A silicon precursor gas, an organic precursor gas, and a porogen gas may be supplied during the deposition process. Supply rates of the organic precursor gas and the porogen gas may gradually increase in the first deposition duration, and supply rates of the silicon precursor gas, the organic precursor gas, and the porogen gas may be constant in the second deposition duration.

In some embodiments, forming the interlayer insulating layer may further include: forming pores in the interlayer insulating layer. The pores may be formed by removing porogen portions that are formed by the porogen gas.

In some embodiments, a pore density of the interlayer insulating layer formed during the second deposition duration may be higher than that of the interlayer insulating layer formed during the first deposition duration.

In some embodiments, a pore density of the interlayer insulating layer formed during the first deposition duration may be gradually increased from a bottom surface toward a top surface of the interlayer insulating layer formed during the first deposition duration.

In some embodiments, forming the interlayer insulating layer may further include: supplying the silicon precursor gas to form a glue layer on the substrate. The glue layer may be formed before the organic precursor gas and the porogen gas are supplied.

In still another aspect, a method of fabricating a semiconductor device may comprise forming an interlayer insulating layer on a substrate, the interlayer insulating layer comprising a lower portion being adjacent to the substrate, a middle portion on the lower portion, and an upper portion on the middle portion, wherein the upper portion of the interlayer insulating layer has recesses; forming conductive patterns in the recesses; etching the upper portion of the interlayer insulating layer to reduce a height of the interlayer insulating layer; and forming a capping insulation layer on the conductive patterns, wherein an air gap is formed between the conductive patterns, wherein a pore density of the lower portion of the interlayer insulating layer is higher than that of the upper portion of the interlayer insulating layer, wherein a pore density of the middle portion is gradually increased toward the upper portion.

In some embodiments, the pore density of the middle portion of the interlayer insulating layer may be higher than or equal to the pore density of the lower portion of the interlayer insulating layer and is lower than or equal to the pore density of the upper portion of the interlayer insulating layer.

In some embodiments, forming the interlayer insulating layer may be performed by a deposition process having a first deposition duration and a second deposition duration, the deposition process being performed by using a silicon precursor gas, an organic precursor gas, and a porogen gas, wherein supply rates of the organic precursor gas and the porogen gas are gradually increased in the first deposition duration, and supply rates of the silicon precursor gas, the organic precursor gas, and the porogen gas are constant in the second deposition duration.

In some embodiments, an atomic ratio of carbon in the upper portion of the interlayer insulating layer may be greater than that of the lower portion of the interlayer insulating layer, and an atomic ratio of carbon in the middle portion of the interlayer insulating layer is gradually increased toward the upper portion of the interlayer insulating layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
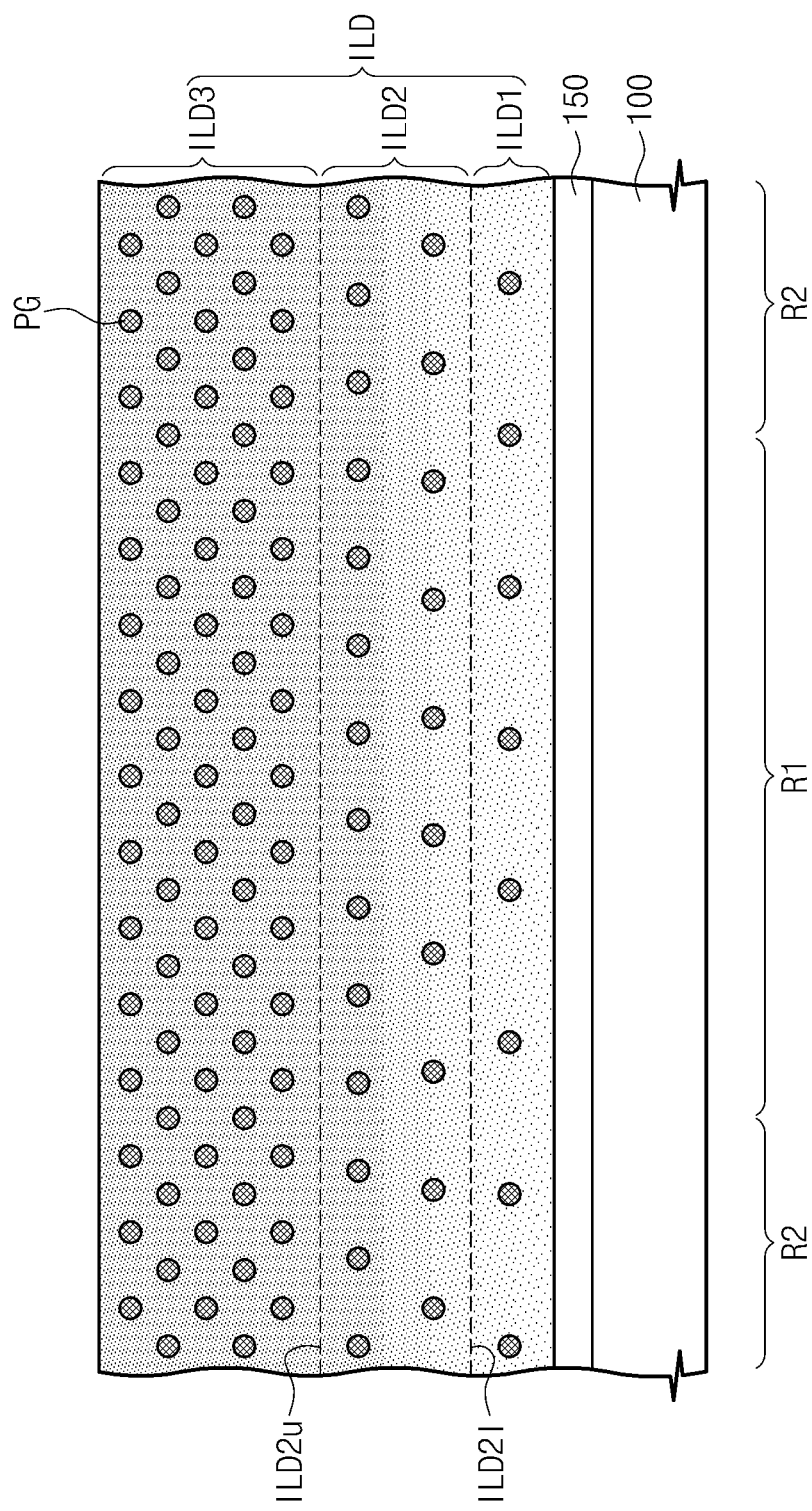
FIGS. 1 and 3 to 6 are cross-sectional views illustrating a method of fabricating a semiconductor device according to some embodiments of the inventive concepts.

The inventive concepts will now be described more fully hereinafter with reference to the accompanying drawings, in which exemplary embodiments of the inventive concepts are shown. Certain advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only as examples of the inventive concepts to let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Further, the term "contacts" as used herein relates to a direct contact, or touching, unless indicated otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concepts.

It will be also understood that although the terms first, second, third etc. may be used herein to describe various elements, these elements should not be limited by these terms. Unless the context indicates otherwise, these terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

FIGS. 1 and 3 to 6 are cross-sectional views illustrating a method of fabricating a semiconductor device according to some embodiments of the inventive concepts. FIG. 7 is a cross-sectional view illustrating a semiconductor device according to other embodiments of the inventive concepts.

Referring to FIG. 1, an interlayer insulating layer IDL may be formed on a substrate 100. The substrate 100 may be, for example, a silicon (Si) substrate, a germanium (Ge) substrate, or a silicon-germanium (SiGe) substrate. An integrated circuit including transistors and/or memory cells may be provided within the substrate 100. The substrate 100 may include a first region R1 and a second region R2.

The interlayer insulating layer IDL may be formed by a deposition process, for example, a chemical vapor deposition (CVD) process. The interlayer insulating layer IDL may include, for example, silicon-carbohydrate (SiCOH). A glue layer 150 may be formed on the substrate 100 before the interlayer insulating layer IDL is deposited.

Figure 2:
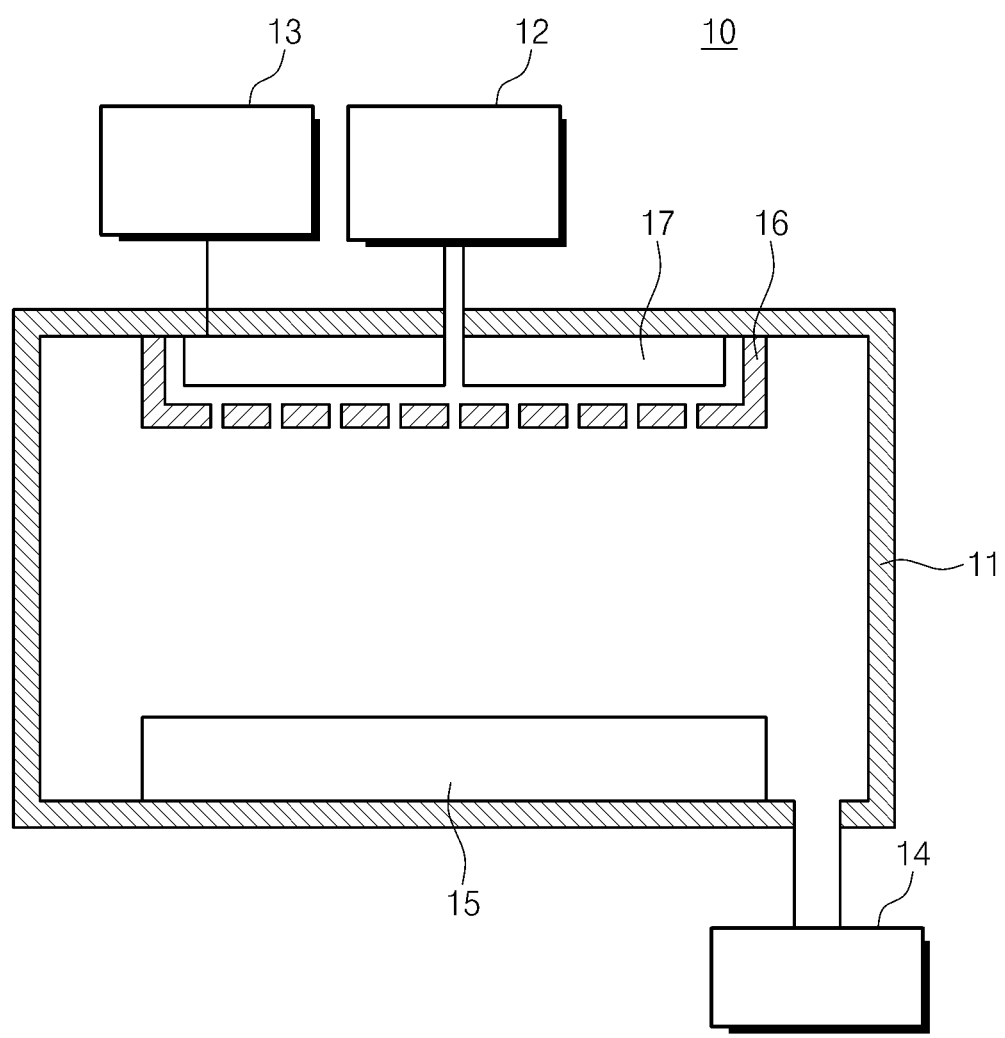
FIG. 2 is a schematic diagram illustrating a semiconductor fabricating apparatus used in a process of depositing an interlayer insulating layer according to some embodiments of the inventive concepts.

FIG. 2 is a schematic diagram illustrating a semiconductor fabricating apparatus used in a process of depositing an interlayer insulating layer according to some embodiments of the inventive concepts.

Referring to FIG. 2, a semiconductor fabricating apparatus 10 may include a chamber 11, a gas supply part 12, a power supply part 13, a vacuum pump 14, and a chuck 15. The chamber 11 may provide an inner space sealed from the outside. The gas supply part 12 may provide a reaction gas (e.g., a silicon precursor gas, an organic precursor gas, and/or a porogen gas) into the chamber 11. A shower head 16 may be disposed in a top end region of the inner space of the chamber 11. The reaction gas may be provided into the chamber 11 through the shower head 16. The shower head 16 may have at least one outlet through which the reaction gas is outputted. An electrode 17 may be disposed in the shower head 16. The power supply part 13 may provide a power to the electrode 17. The electrode 17 may induce plasma reaction of the reaction gas provided in the shower head 16 and the chamber 11.

Referring to FIGS. 1 and 2, the substrate 100 may be loaded into the chamber 11 of the semiconductor fabricating apparatus 10. For example, the substrate 100 may be located on the chuck 15 disposed in the chamber 11.

The glue layer 150 may be deposited on the substrate 100. For example, a silicon precursor gas may be provided into the chamber 11 through the gas supply part 12. Silicon oxide including silicon-oxygen (—Si—O—) bonds may be formed by the silicon precursor gas during the deposition process of the glue layer 150. Thus, the glue layer 150 may include silicon oxide ($SiO_2$).

The deposition process of the interlayer insulating layer IDL may include a first deposition duration and a second deposition duration. In the first deposition duration, an organic precursor gas and a porogen gas may be gradually added to the silicon precursor gas. Here, the organic precursor gas may include a material that is composed of carbon, oxygen, and hydrogen. The porogen gas may include, for example, a hydrocarbon ($C_xH_y$)-based material (where "x" and "y" are positive real numbers). An interlayer insulating layer formed during the first deposition duration may correspond to a first portion IDL1 and a second portion IDL2 of the interlayer insulating layer IDL. Here, the first portion IDL1 may correspond to a lower portion of the interlayer insulating layer IDL and may be adjacent to the substrate 100. The second portion IDL2 may be provided on the first portion IDL1 and may correspond to an intermediate portion of the interlayer insulating layer IDL. The interlayer insulating layer IDL may include, for example, SiCOH. Since the organic precursor gas is additionally provided to the silicon precursor gas, silicon-carbon (—Si—C—) bonds and/or silicon-hydrogen (—Si—H—) bonds may be further formed in the interlayer insulating layer IDL along with the silicon-oxygen (—Si—O—) bonds. In addition, as a supply rate of the organic precursor gas is gradually increased, the amount of the silicon-carbon (—Si—C—) bonds may be gradually increased. For example, the first and second portions IDL1 and IDL2 of the interlayer insulating layer may include a portion of which an atomic ratio of carbon is gradually increased from its bottom surface toward its top surface. In some embodiments, the atomic ratio of carbon of the second portion IDL2 of the interlayer insulating layer may be gradually increased from a bottom surface IDL2*l* of the second portion IDL2 to a specific level and may be uniform from the specific level to a top surface IDL2*u* of the second portion IDL2. The atomic ratio of carbon of the second portion IDL2 at the top surface IDL2*u* may be equal to that of the second portion IDL2 at the specific level. The specific level may be disposed between the bottom surface IDL2*l* and the top surface IDL2*u* of the second portion IDL2.

Since the porogen gas is additionally supplied, porogen portions PG may be dispersed in the interlayer insulating layer IDL. The porogen portions PG may be formed to be adjacent to silicon-carbon (—Si—C—) bonds. If the silicon-carbon (—Si—C—) bonds are not formed in the interlayer insulating layer IDL, the porogen portions PG may not be formed in the interlayer insulating layer IDL. Since the interlayer insulating layer IDL of the inventive concepts includes the silicon-carbon (—Si—C—) bonds, the porogen portions PG may be formed in the interlayer insulating layer IDL. The porogen portions PG may include the hydrocarbon ($C_xH_y$) based material described an example of the porogen gas. Since the number of the silicon-carbon (—Si—C—) bonds is small in the first portion IDL1 of the interlayer insulating layer, a density of the porogen portions PG of the first portion IDL1 may be very low. As the supply rate of the porogen gas and the number of the silicon-carbon (—Si—C—) bonds are gradually increased, the density of the porogen portions PG may be gradually increased in the second portion IDL2 of the interlayer insulating layer. For example, the density of the porogen portions PG may be gradually increased from the bottom surface IDL2*l* to the top surface IDL2*u* of the second portion IDL2 of the interlayer insulating layer. Ramping rates of the organic precursor gas and the porogen gas supplied to the gas supply part 12 may be adjusted to control thicknesses of the first and second portions IDL1 and IDL2 of the interlayer insulating layer. The supply rate and the ramping rate of the organic precursor gas may be different from those of the porogen gas, respectively. An interval for which atomic ratio of carbon gradually increases in the interlayer insulating layer IDL may be shorter than an interval for which the density of the porogen portions PG gradually increases in the interlayer insulating layer IDL. Thus, after the silicon-carbon (—Si—C—) bonds for the formation of the porogen portions PG are sufficiently formed, the porogen portions PG may be formed.

In the second deposition duration, the silicon precursor gas, the organic precursor gas, and the porogen gas may be uniformly supplied. For example, supply rates of the silicon precursor gas, the organic precursor gas, and the porogen gas may be constant during the second deposition duration. The first deposition duration and the second deposition duration may be continuously performed. Supply rates of the organic precursor gas and the porogen gas during the second deposition duration may be equal to those of the increased organic precursor gas and porogen gas of the first deposition duration, respectively. The interlayer insulating layer IDL deposited during the second deposition duration may correspond to a third portion IDL3 of the interlayer insulating layer. The third portion IDL3 may be provided on the second portion IDL2 and may correspond to an upper portion of the interlayer insulating layer IDL. An atomic ratio of carbon and a density of the porogen portions PG may be uniform in the third portion IDL3 of the interlayer insulating layer. The atomic ratio of carbon and the density of the porogen portions PG in the third portion IDL3 of the interlayer insulating layer may be greater than those of the first portion IDL1 of the interlayer insulating layer, respectively. The density of the porogen portions PG of the third portion IDL3 may be equal to the density of the porogen portions PG of the top surface IDL2*u* of the second portion IDL2, i.e., a maximum value of the density of the porogen portions PG of the second portion IDL2. The atomic ratio of carbon in the third portion IDL3 may be substantially equal to a maximum value of the atomic ratio of carbon in the second portion IDL2. The interlayer insulating layer IDL may be well adhered to the substrate 100 by the glue layer 150. The substrate 100 may be unloaded from the semiconductor fabricating apparatus 10 after the deposition of the interlayer insulating layer IDL is completed.

Figure 3:
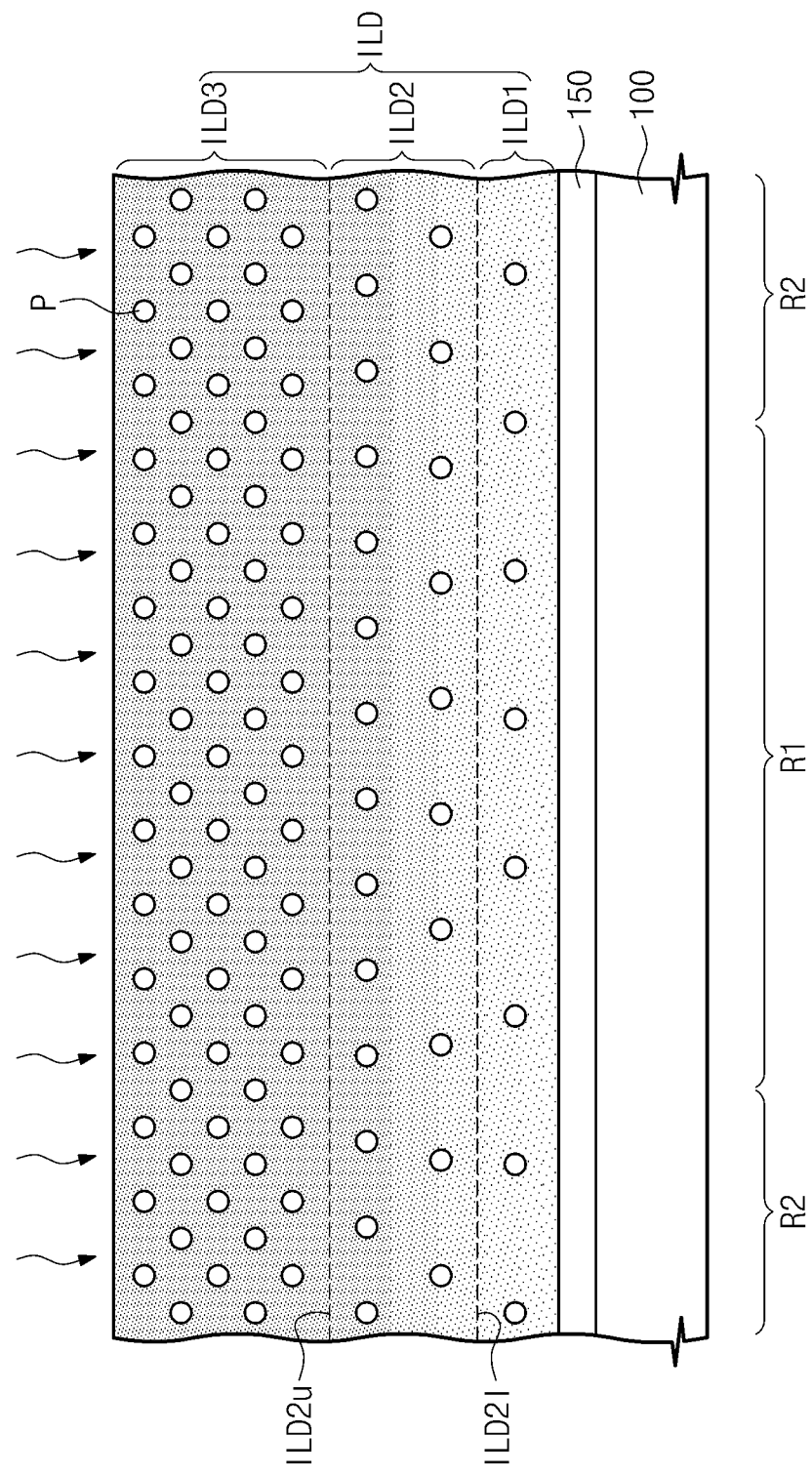

Referring to FIG. 3, the porogen portions PG may be removed to form pores P in the interlayer insulating layer IDL. For example, a ultraviolet ray or heat may be applied to the interlayer insulating layer IDL. In some embodiments, the interlayer insulating layer IDL may be thermally treated at a temperature of about 400° C. The hydrocarbon materials included in the porogen portions PG may be removed by irradiating the ultraviolet ray or by the thermal treatment. Thus, the pores P may be formed in the interlayer insulating layer IDL. A density of the pores P of the third portion IDL3 of the interlayer insulating layer may be higher than that of the first portion IDL1 of the interlayer insulating layer. Due to the pores P, a dielectric constant of the third portion IDL3 of the interlayer insulating layer may be lower than that of the first portion IDL1 of the interlayer insulating layer. A density of the pores P in the second portion IDL2 of the interlayer insulating layer may become progressively greater from the bottom surface IDL2*l* to the top surface IDL2*u* of the second portion IDL2. The density of the pores P of the second portion IDL2 may be greater than or equal to that of the first portion IDL1 and may be less than or equal to that of the third portion IDL3. The density of the pores P may be uniform in the third portion IDL3 of the interlayer insulating layer. The portion, in which the atom ratio of carbon gradually increases, of the interlayer insulating layer IDL may be thinner than a portion, in which the density of the pores P gradually increases, of the interlayer insulating layer IDL. According to embodiments of the inventive concepts, the supply gases of the first and second deposition durations may be controlled to easily form the interlayer insulating layer IDL having the densities of pores P different from each other.

Figure 4:
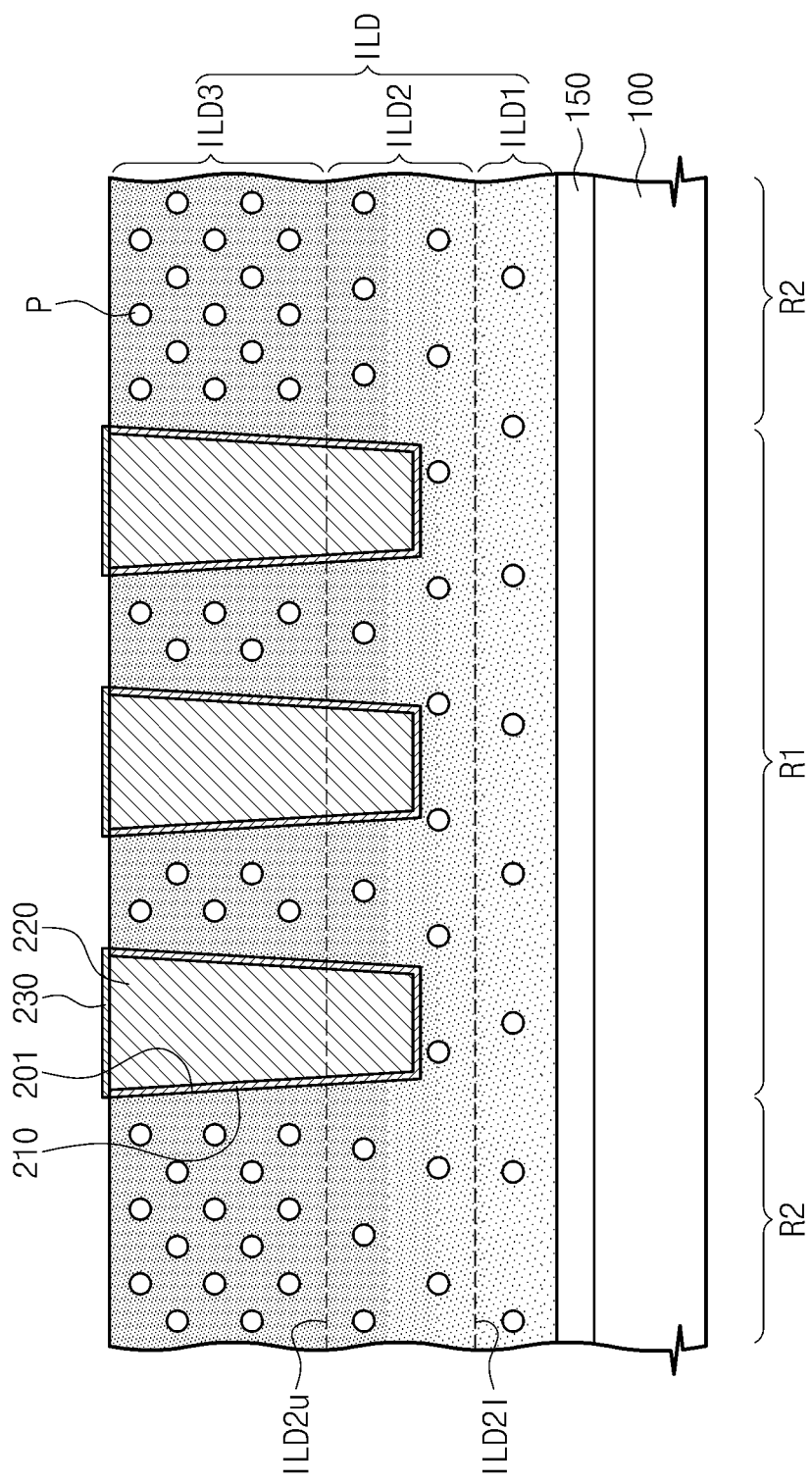

Referring to FIG. 4, conductive patterns 220 may be formed in the interlayer insulating layer IDL. The conductive patterns 220 may be formed in the first region R1 of the substrate 100. As described above, the integrated circuit including the transistors and/or the memory cells may be provided in the substrate 100. The conductive patterns 220 may be formed, for example, using a damascene process. For example, recesses 201 may be formed to penetrate the third portions IDL3 of the interlayer insulating layer. The recesses 201 may further penetrate at least a portion of the second portion IDL2. The recesses 201 may expose plugs (not shown). The plugs (not shown) may be electrically connected to the integrated circuit. The recesses 201 may be laterally spaced apart from each other.

A barrier pattern 210 may be formed on a bottom surface and a sidewall of each of the recesses 201. The barrier pattern 210 may include at least one of tantalum (Ta), titanium (Ti), tantalum nitride (TaN), or titanium nitride (TiN). The conductive patterns 220 may be formed on the barrier patterns 210 in the recesses 201, respectively. A central axis of each of the conductive patterns 220 may be substantially perpendicular to the top surface of the substrate 100. Bottom surfaces of the conductive patterns 220 may be provided in the second portion IDL2 of the interlayer insulating layer IDL. In certain embodiments, the conductive patterns 220 may be metal lines. For example, the conductive patterns 220 may extend in parallel in one direction parallel to the top surface of the substrate 100. The conductive patterns 220 may include a metal, for example, copper. The barrier patterns 210 may prevent the material included in the conductive patterns 220 from being diffused into the interlayer insulating layer IDL. A conductive pattern-protecting layer 230 may be formed on each of the conductive patterns 220. The conductive pattern-protecting layers 230 may be laterally spaced apart from each other and may be electrically insulated from each other. The conductive pattern-protecting layers 230 may include at least one of tungsten (W), cobalt (Co), or cobalt-tungsten-phosphorus (CoWP). In certain embodiments, the conductive patterns 220 are not exposed outside by the conductive pattern-protecting layers 230.

Figure 5:
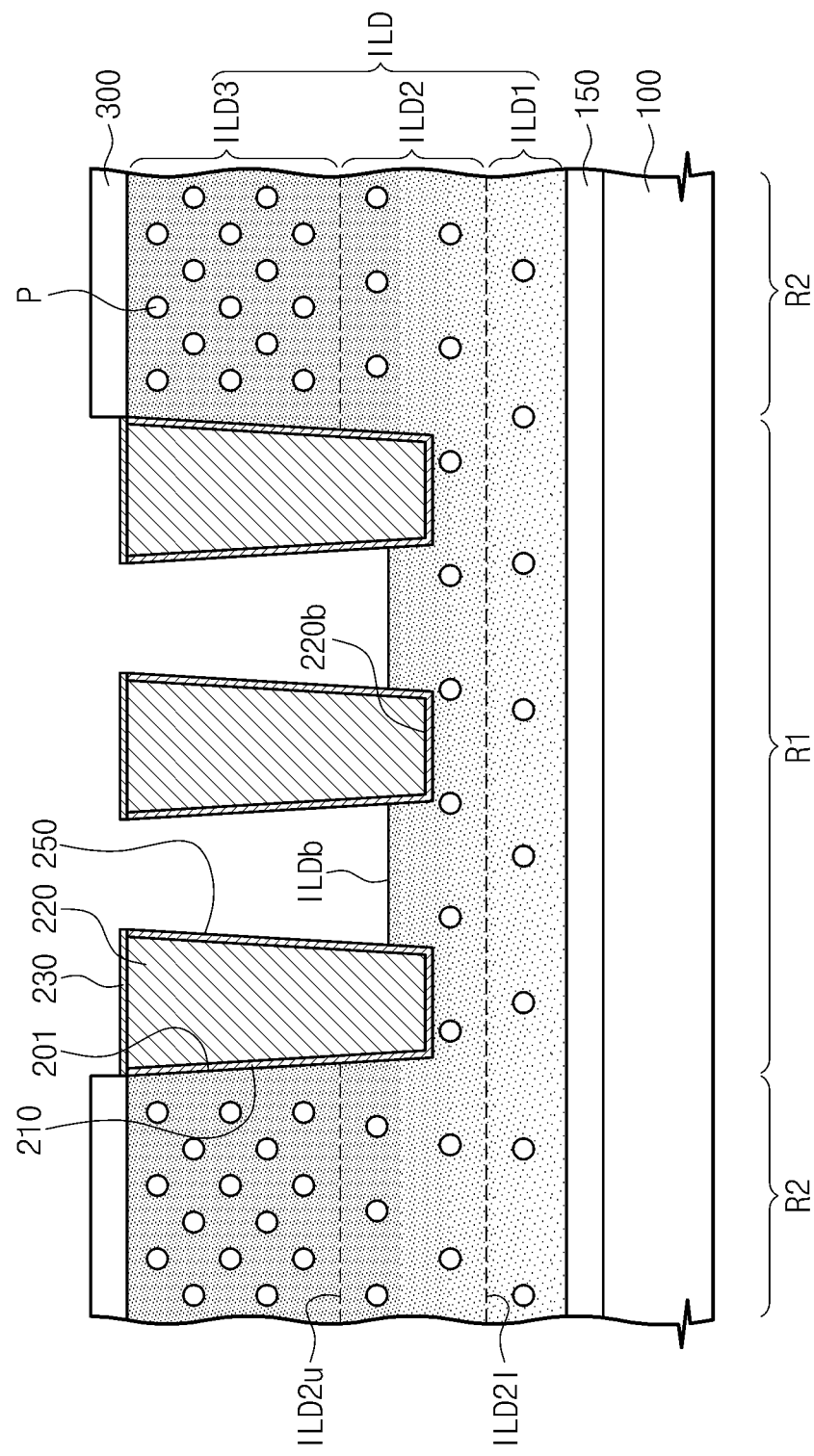

Referring to FIG. 5, the third portion IDL3 of the interlayer insulating layer disposed in the first region R1 may be removed to form a groove 250 between the conductive patterns 220. For example, a mask pattern 300 may be formed on the interlayer insulating layer IDL in the second region R2. The mask pattern 300 may expose the interlayer insulating layer IDL disposed in the first region R1. An etching process may be performed using the mask pattern 300. At this time, an etch rate of the third portion IDL3 of the interlayer insulating layer may be higher than that of the first portion IDL1 of the interlayer insulating layer due to a difference between the density of the pores P of the third portion IDL3 and the density of the pores of the first portion IDL1. Thus, the interlayer insulating layer IDL may be selectively etched. During the etching process, a portion of the second portion IDL2 of the interlayer insulating layer may also be etched. If the etch rate of the third portion IDL3 of the interlayer insulating layer is equal to that of the first portion IDL1 of the interlayer insulating layer, it may be difficult to control the etching of the interlayer insulating layer IDL. For example, an etched bottom surface IDLb of the interlayer insulating layer IDL may be lower than bottom surfaces 220b of the conductive patterns 220 or may not be uniform. Thus, the conductive patterns 220 may be oblique to the top surface of the substrate 100. However, since the interlayer insulating layer IDL according to certain embodiments have the densities of the pores P different from each other, the interlayer insulating layer IDL removed by the etching process may be controlled. As the portion, in which the density of the pores P gradually increases, of the interlayer insulating layer IDL increases, the interlayer insulating layer IDL removed by the etching process may be easily controlled. For example, a level of the etched bottom surface IDLb of the interlayer insulating layer IDL may be the same as or higher than that of the bottom surface 220b of the conductive pattern 220. Thus, a leaning phenomenon of the conductive patterns 220 may be prevented, and the conductive patterns 200 may be substantially perpendicular to the top surface of the substrate 100. As such, it is possible to fabricate the semiconductor device 1 having high reliability. If the interlayer insulating layer IDL is etched by a dry etching process, the conductive patterns 220 may be damaged. However, the conductive pattern-protecting layers 230 may prevent the conductive patterns 220 from being damaged by the etching process.

After the etching process, the density of the pores P and the atom ratio of carbon in the top surface of interlayer insulating layer IDL disposed in the second region R2 may be higher than those of a top surface of the interlayer insulating layer IDL disposed in the first region R1. However, at the same level, the interlayer insulating layer IDL of the second region R2 and the interlayer insulating layer IDL of the first region R1 may have a substantially same density of the pores P and a substantially same atomic ratio of carbon. The densities of the pores P and the atom ratios of carbon of the first, second, and third portions IDL1, IDL2, and IDL3 of the interlayer insulating layer IDL in the second region may be the same as described above. Thereafter, the mask pattern 300 may be removed.

Figure 6:
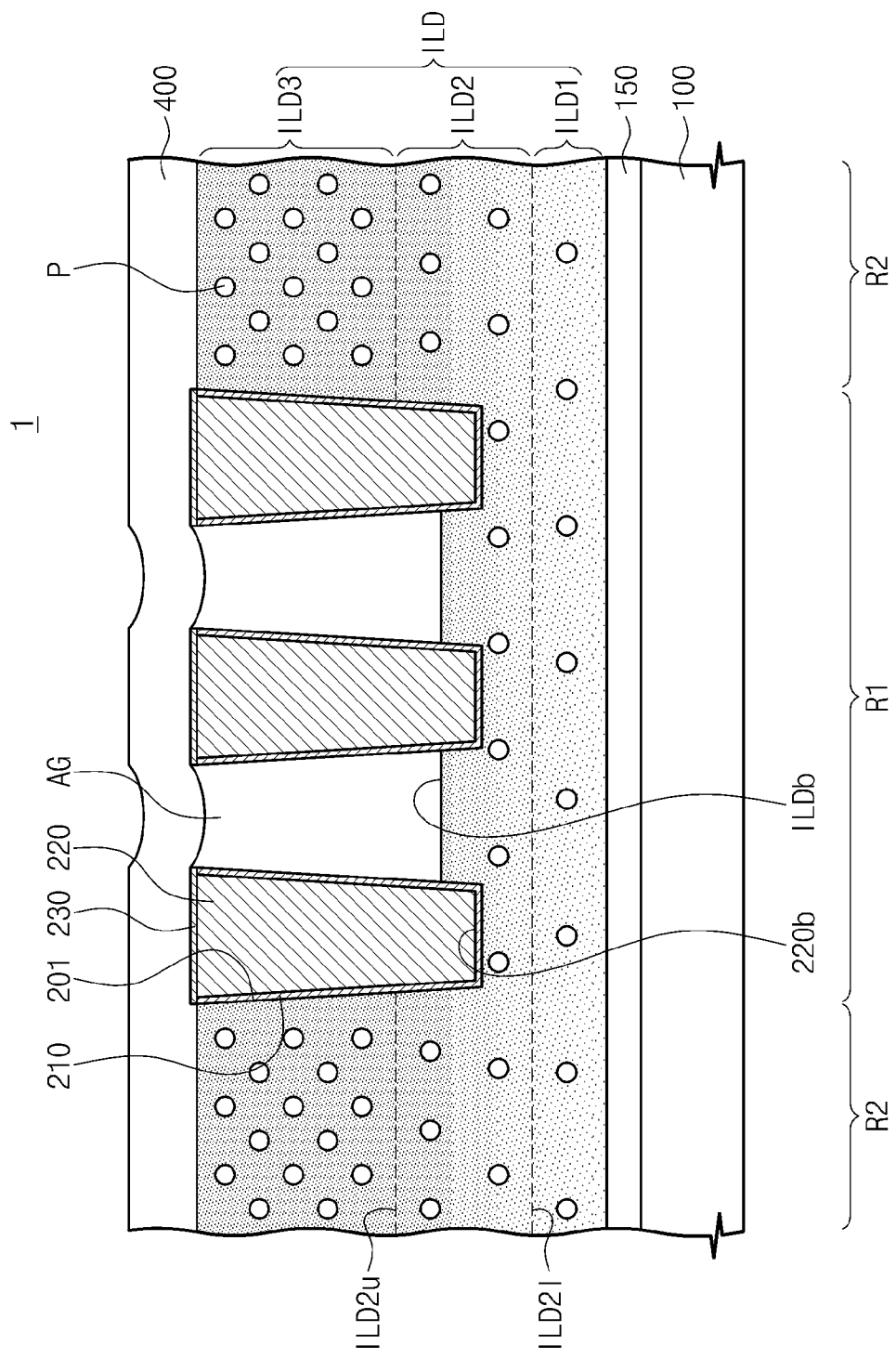
Figure 7:
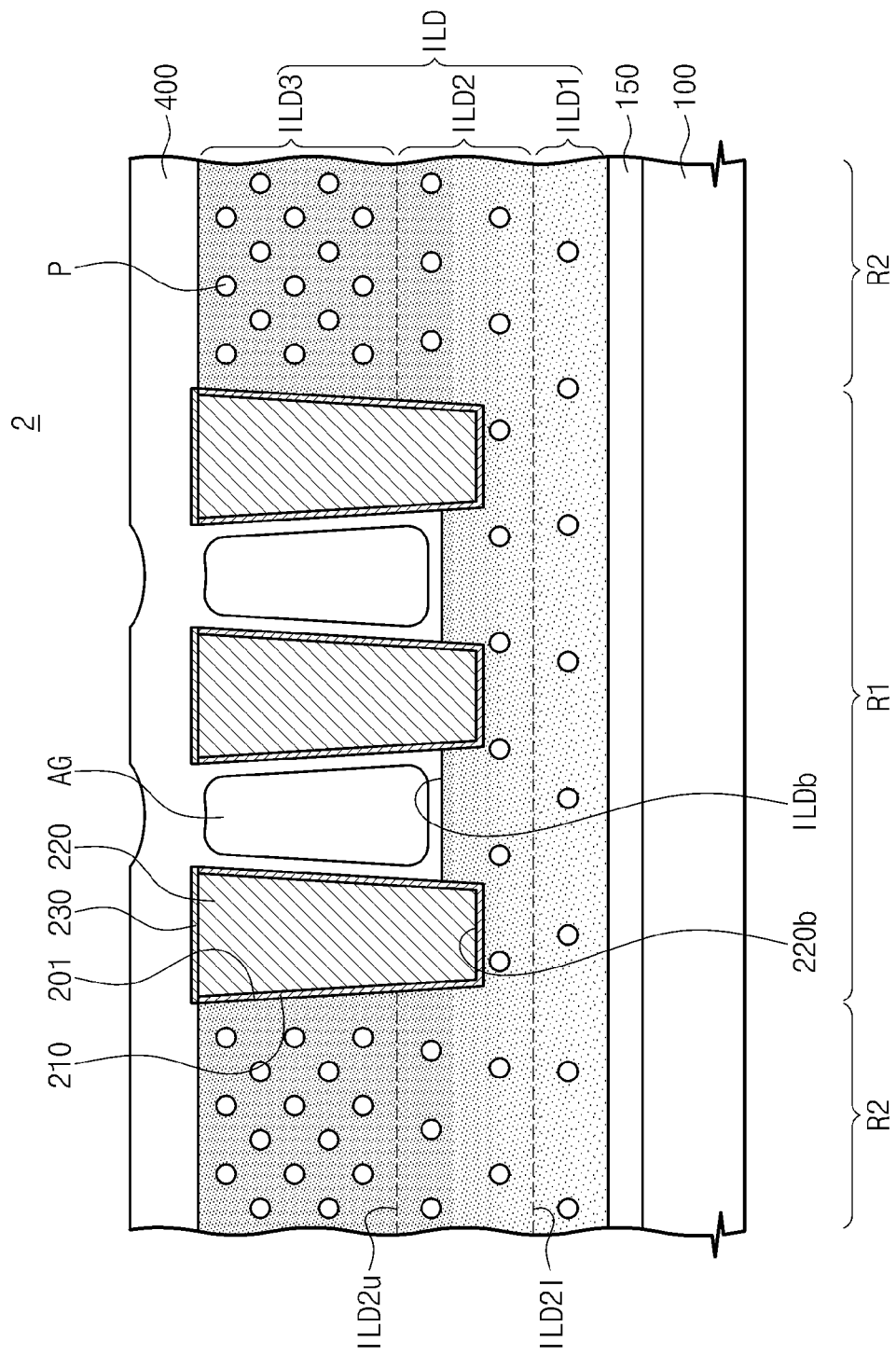
FIG. 7 is a cross-sectional view illustrating a semiconductor device according to other embodiments of the inventive concepts.

Referring to FIGS. 6 and 7, a capping insulation layer 400 may be formed on the interlayer insulating layer IDL and the conductive patterns 220. In some embodiments, the capping insulation layer 400 may be formed by a chemical vapor deposition (CVD) method. The capping insulation layer 400 may include at least one of silicon oxide, silicon nitride, and silicon carbonitride (SiCN). The capping insulation layer 400 with low (or poor) step coverage may be deposited on the conductive patterns 220, so an air gap AG may be formed between the conductive patterns 220. In some embodiments, as illustrated in FIG. 6, the capping insulation layer 400 may fill only an upper portion of the groove 250 provided between the conductive patterns 220. In other embodiments, as illustrated in FIG. 7, the capping insulation layer 400 may cover a bottom surface and a sidewall of the groove 250 but may not fill the groove 250. Thus, the air gap AG may be formed between the conductive patterns 220. The air gap AG may include air of which a dielectric constant is lower than that of the interlayer insulating layer IDL. As a result, a parasitic capacitance between the conductive patterns 220 may be reduced in semiconductor devices 1 and 2 provided with the air gaps AG. Fabrication of the semiconductor devices 1 and 2 may be completed by the embodiments described above.

As used herein, a semiconductor device may refer to devices that include the features such as shown in FIG. 6 or 7. Semiconductor devices described herein may refer, for example, to transistors, or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

[Applications]

Figure 8:
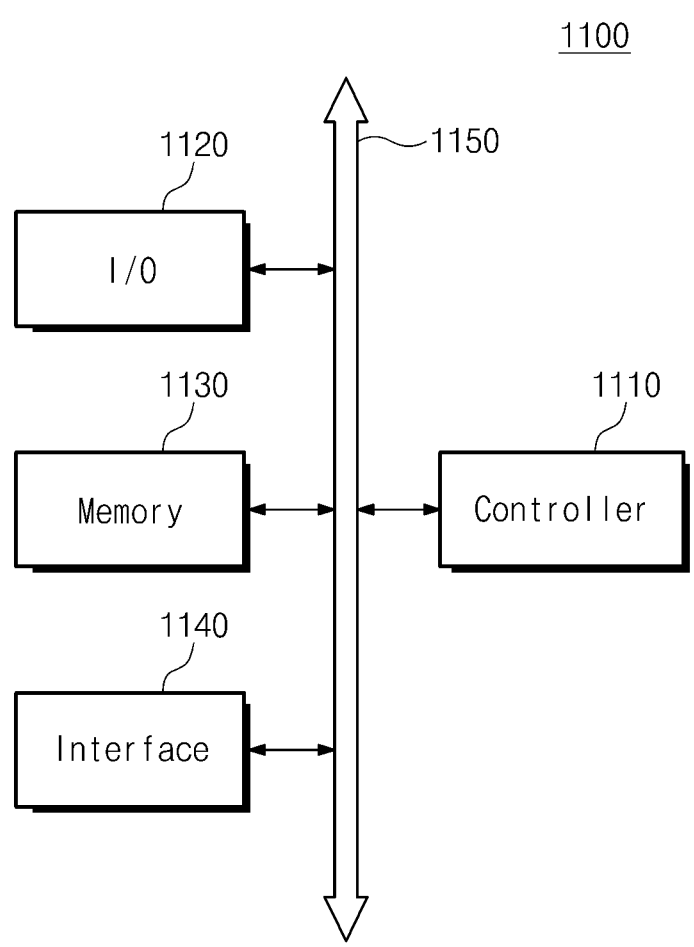
FIG. 8 is a schematic block diagram illustrating an embodiment of a memory system including a semiconductor device according to embodiments of the inventive concepts.

FIG. 8 is a schematic block diagram illustrating an embodiment of a memory system including a semiconductor device according to embodiments of the inventive concepts.

Referring to FIG. 8, a memory system 1100 may be used in an electronic device such as a personal digital assistant (PDA), a portable computer, a web tablet, a wireless phone, a mobile phone, a digital music player, a memory card, or other electronic products receiving or transmitting information data by wired or wireless communication.

The memory system 1100 may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150.

The controller 1110 may include at least one of a microprocessor, a digital signal processor, a microcontroller, or other logic devices. Functions of the other logic devices may be similar to those of the microprocessor, the digital signal processor and the microcontroller. The memory device 1130 may store commands that are to be executed by the controller 1110. The I/O unit 1120 may receive data or signals from an external system or may output data or signals to the external system. For example, the I/O unit 1120 may include a keypad, a keyboard and/or a display device.

The memory device 1130 may include at least one of the semiconductor devices according to the aforementioned embodiments of the inventive concepts. The memory device 1130 may further include at least one of another type of semiconductor memory devices and/or volatile random access memory devices.

The interface unit 1140 may transmit electrical data to a communication network or may receive electrical data from a communication network.

Figure 9:
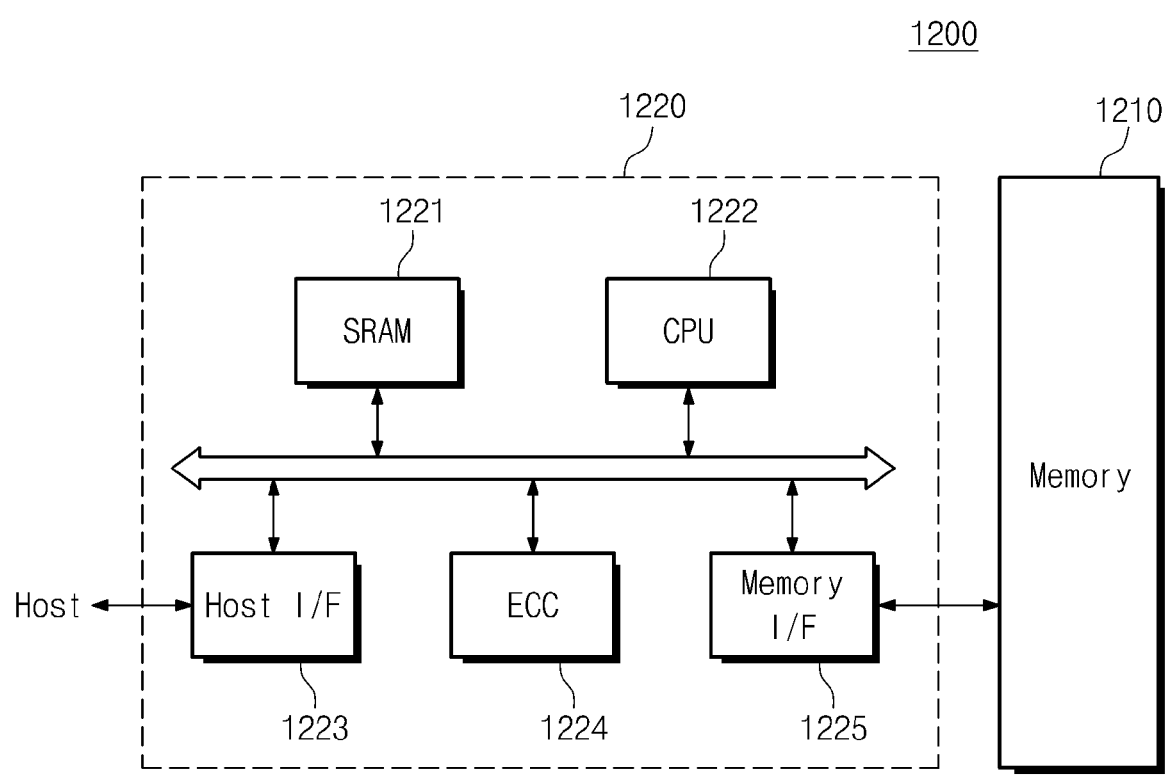
FIG. 9 is a schematic block diagram illustrating an embodiment of a memory card including a semiconductor device according to embodiments of the inventive concepts.

FIG. 9 is a schematic block diagram illustrating an embodiment of a memory card including a semiconductor device according to embodiments of the inventive concepts.

Referring to FIG. 9, a memory card 1200 for storing high-capacity data may include a flash memory device 1210 implemented with at least one of the semiconductor devices according to embodiments of the inventive concepts. The memory card 1200 may further include a memory controller 1220 that controls data communication between a host and the flash memory device 1210.

A static random access memory (SRAM) device 1221 may be used as a working memory of a central processing unit (CPU) 1222. A host interface unit 1223 may be configured to include a data communication protocol between the memory card 1200 and the host. An error check and correction (ECC) block 1224 may detect and correct errors of data which are read out from the flash memory device 1210. A memory interface unit 1225 may interface with the flash memory device 1210. The CPU 1222 may control overall operations of the memory controller 1220 for exchanging data. Even though not shown in the drawings, the memory card 1200 may further include a read only memory (ROM) storing code data for interfacing with the host.

According to the semiconductor device, the memory card, or the memory system described above, a highly integrated memory system may be provided. In particular, the semiconductor device may be applied to the memory system such as a solid state drive (SSD) device that has been developed. In this case, the highly integrated memory system may be realized.

Figure 10:
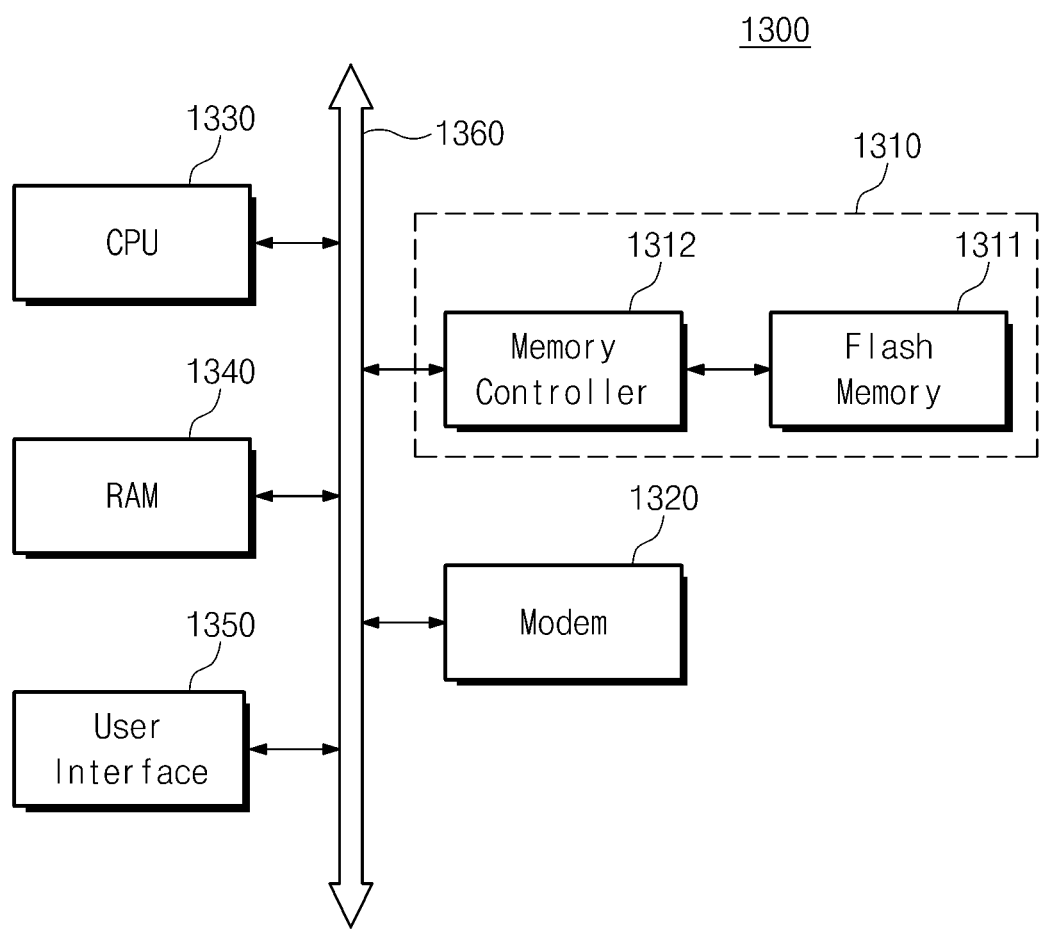
FIG. 10 is a schematic block diagram illustrating an example of an information processing system including a semiconductor device according to embodiments of the inventive concepts.

FIG. 10 is a schematic block diagram illustrating an embodiment of an information processing system including a semiconductor device according to embodiments of the inventive concepts.

Referring to FIG. 10, an information processing system 1300 (e.g., a mobile device or a desk top computer) may include a memory system 1310 including a flash memory device 1311 and a memory controller 1312. The flash memory device 1311 may be implemented with at least one of the semiconductor devices according to embodiments of the inventive concepts. The memory controller 1312 may control data communication between a system bus 1360 and the flash memory device 1311. The information processing system 1300 may further include a modulator and demodulator (Modem) 1320, a central processing unit (CPU) 1330, a random access memory (RAM) device 1340, and a user interface unit 1350 which are electrically connected to the memory system 1310 through the system bus 1360. The memory system 1310 may be a substantially same as the memory card described with reference to FIG. 9. The memory system 1310 may store data inputted from an external system and/or data processed by the CPU 1330. In some embodiments, the memory system 1310 may be realized as a solid state disk (SSD). In this case, the information processing system 1330 may stably store massive data into the flash memory system. In addition, as reliability of the memory system 1310 increases, the memory system 1310 may reduce a resource consumed for correcting errors. Even though not shown in the drawings, an application chipset, a camera image processor (CIS), and an input/output unit may further be provided in the information processing system 1300. In addition, the semiconductor devices and/or the memory system according to the embodiments of the inventive concepts may be encapsulated using various packaging techniques.

The interlayer insulating layer according to the disclosed embodiments may be formed by the deposition process including the first deposition duration and the second deposition duration. The pore density of an upper portion (i.e., the third portion) of the interlayer insulating layer may be higher than that of a lower portion (i.e., the first portion) of the interlayer insulating layer. Thus, the etch rate of the upper portion of the interlayer insulating layer may be higher than that of the lower portion of the interlayer insulating layer. The pore densities of the interlayer insulating layer may be adjusted to control the height of the remaining portion of the interlayer insulating layer after the interlayer is etched to form the air gap. The bottom surfaces of the conductive patterns may be disposed in an intermediate portion (i.e., the second portion) of the interlayer insulating layer after etching the interlayer insulating layer. Thus, it is possible to prevent the conductive patterns from leaning by the etching process. According to embodiments of the inventive concepts, the interlayer insulating layer having the different pore densities and different etch rates may be easily fabricated.

Semiconductor devices according to certain disclosed embodiments include the air gap, so the parasitic capacitance between the conductive patterns may be reduced.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but are illustrative. Thus, the scope of the inventive concepts is to be determined by the broadest permissible interpretation of the following claims and their equivalents, and shall not be restricted or limited by the foregoing description.

What is claimed is:

1. A method of fabricating a semiconductor device, the method comprising:
    forming an interlayer insulating layer on a substrate, the interlayer insulating layer comprising: a first portion being adjacent to the substrate and having a first pore density; a second portion formed on the first portion; and a third portion formed on the second portion and having a second pore density higher than the first pore density, and a pore density of the second portion gradually increasing toward the third portion;
    forming conductive patterns penetrating the third portion of the interlayer insulating layer;
    etching the third portion of the interlayer insulating layer to reduce a height of the interlayer insulating layer; and
    forming a capping insulation layer on the conductive patterns,
    wherein an air gap is formed between the conductive patterns.

2. The method of claim 1, wherein the pore density of the second portion of the interlayer insulating layer is higher than or equal to the first pore density and is lower than or equal to the second pore density.

3. The method of claim 1, wherein forming the interlayer insulating layer is performed by a deposition process having a first deposition duration and a second deposition duration, the deposition process being performed by using a silicon precursor gas, an organic precursor gas, and a porogen gas,
    wherein supply rates of the organic precursor gas and the porogen gas are gradually increased in the first deposition duration, and
    wherein supply rates of the silicon precursor gas, the organic precursor gas, and the porogen gas are constant in the second deposition duration.

4. The method of claim 1, wherein forming the interlayer insulating layer comprises:
    forming porogen portions in the interlayer insulating layer; and
    forming pores in the interlayer insulating layer by removing the porogen portions.

5. The method of claim 4, wherein forming the pores comprises applying heat or an ultraviolet ray to the interlayer insulating layer to remove a hydrocarbon material included in the porogen portions.

6. The method of claim 1, wherein an atomic ratio of carbon in the third portion of the interlayer insulating layer is greater than that of the first portion of the interlayer insulating layer, and
    wherein an atomic ratio of carbon in the second portion of the interlayer insulating layer is gradually increased toward the third portion of the interlayer insulating layer.

7. The method of claim 1, wherein an etch rate of the third portion of the interlayer insulating layer is higher than that of the first portion of the interlayer insulating layer.

8. The method of claim 1, wherein the substrate includes a first region and a second region and the conductive patterns are formed in the first region, and
    wherein etching the third portion of the interlayer insulating layer comprises:
    forming a mask pattern exposing the interlayer insulating layer of the first region; and
    etching the third portion of the interlayer insulating layer of the first region using the mask pattern as an etch mask.

9. The method of claim 1, wherein a bottom surface, which is formed between the conductive patterns after etching the third portion, of the interlayer insulating layer is disposed at the same level as or a higher level than bottom surfaces of the conductive patterns.

10. The method of claim 1, wherein forming the air gap comprises:
    forming a groove between the conductive patterns by etching the third portion of the interlayer insulating layer, and
    forming the capping insulation layer to close an upper portion of the groove.

11. A method of fabricating a semiconductor device, the method comprising:
    forming an interlayer insulating layer on a substrate;
    forming recesses in the interlayer insulating layer;
    forming conductive patterns filling the recesses;
    removing an upper portion of the interlayer insulating layer disposed between the conductive patterns to reduce a height of the interlayer insulating layer; and
    forming a capping insulation layer on the conductive patterns to form an air gap between the conductive patterns,
    wherein the interlayer insulating layer is formed by a deposition process including a first deposition duration and a second deposition duration,
    wherein a silicon precursor gas, an organic precursor gas, and a porogen gas are supplied during the deposition process,
    wherein supply rates of the organic precursor gas and the porogen gas gradually increase in the first deposition duration, and
    wherein supply rates of the silicon precursor gas, the organic precursor gas, and the porogen gas are constant in the second deposition duration.

12. The method of claim 11, wherein forming the interlayer insulating layer further comprises forming pores in the interlayer insulating layer,
    wherein the pores are formed by removing porogen portions that are formed by the porogen gas.

13. The method of claim 12, wherein a pore density of the interlayer insulating layer formed during the second deposition duration is higher than that of the interlayer insulating layer formed during the first deposition duration.

14. The method of claim 12, wherein a pore density of the interlayer insulating layer formed during the first deposition duration is gradually increased from a bottom surface toward a top surface of the interlayer insulating layer formed during the first deposition duration.

15. The method of claim 11, wherein forming the interlayer insulating layer further comprises supplying the silicon precursor gas to form a glue layer on the substrate,
    wherein the glue layer is formed before the organic precursor gas and the porogen gas are supplied.

16. The method of claim 11, wherein an atomic ratio of carbon in the interlayer insulating layer formed during the second deposition duration is greater than that of the interlayer insulating layer formed during the first deposition.

17. A method of fabricating a semiconductor device, the method comprising:
forming an interlayer insulating layer on a substrate, the interlayer insulating layer comprising a lower portion being adjacent to the substrate, a middle portion on the lower portion, and an upper portion on the middle portion, wherein the upper portion of the interlayer insulating layer has recesses;
forming conductive patterns in the recesses;
etching the upper portion of the interlayer insulating layer to reduce a height of the interlayer insulating layer; and
forming a capping insulation layer on the conductive patterns, wherein an air gap is formed between the conductive patterns,
wherein a pore density of the lower portion of the interlayer insulating layer is higher than that of the upper portion of the interlayer insulating layer, wherein a pore density of the middle portion is gradually increased toward the upper portion.

18. The method of claim 17, wherein the pore density of the middle portion of the interlayer insulating layer is higher than or equal to the pore density of the lower portion of the interlayer insulating layer and is lower than or equal to the pore density of the upper portion of the interlayer insulating layer.

19. The method of claim 17, wherein forming the interlayer insulating layer is performed by a deposition process having a first deposition duration and a second deposition duration, the deposition process being performed by using a silicon precursor gas, an organic precursor gas, and a porogen gas,
wherein supply rates of the organic precursor gas and the porogen gas are gradually increased during the first deposition duration, and
wherein supply rates of the silicon precursor gas, the organic precursor gas, and the porogen gas are constant during the second deposition duration.

20. The method of claim 17, wherein an atomic ratio of carbon in the upper portion of the interlayer insulating layer is greater than that of the lower portion of the interlayer insulating layer, and wherein an atomic ratio of carbon in the middle portion of the interlayer insulating layer is gradually increased toward the upper portion of the interlayer insulating layer.

* * * * *